Figure 1:
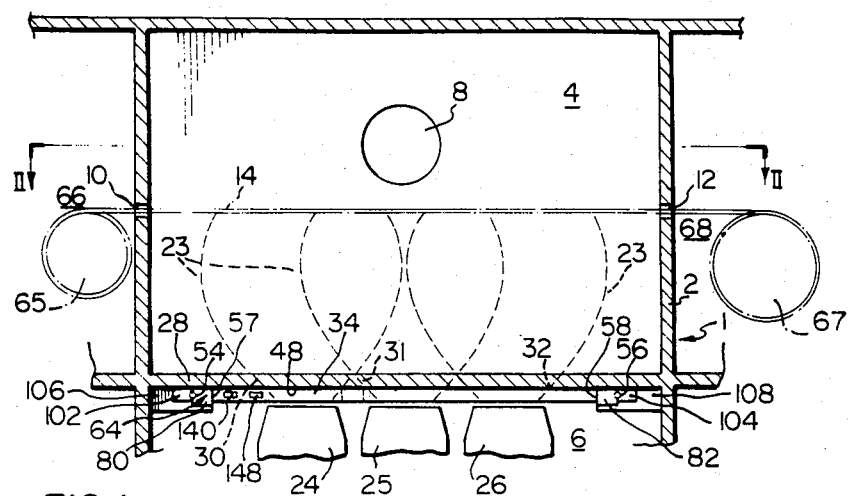

United States Patent [19]

Ranger

[11] Patent Number: 4,478,174
[45] Date of Patent: Oct. 23, 1984

[54] VACUUM COATING VESSEL WITH MOVABLE SHUTTER PLATE

[75] Inventor: Martial Ranger, Gloucester, Canada

[73] Assignee: Canadian Patents & Development Limited, Ottawa, Canada

[21] Appl. No.: 580,229

[22] Filed: Feb. 15, 1984

[30] Foreign Application Priority Data

Feb. 25, 1983 [CA] Canada .................................. 422458

[51] Int. Cl.³ ............................................. C23C 13/08
[52] U.S. Cl. ...................................... 118/718; 118/719; 118/720; 118/724; 118/726; 118/733
[58] Field of Search ............... 118/718, 719, 733, 726, 118/720, 724, 504, 728; 427/255.5

[56] References Cited

U.S. PATENT DOCUMENTS

| | | | |
|---|---|---|---|
| 2,228,794 | 1/1966 | Ames | 118/720 X |
| 3,206,322 | 9/1965 | Morgan | 118/720 X |
| 3,213,825 | 10/1965 | Cooper et al. | 118/724 |
| 3,312,190 | 4/1967 | Bradshaw | 118/720 |
| 3,524,426 | 8/1970 | Ogle, Jr. et al. | 118/733 X |
| 3,568,632 | 3/1971 | Cawthon | 118/719 |
| 3,641,973 | 2/1972 | Shrader | 118/719 |
| 3,649,339 | 3/1972 | Smith | 118/733 X |
| 4,047,624 | 9/1977 | Dorenbos | 118/733 X |
| 4,207,836 | 6/1980 | Nonaka | 118/720 X |
| 4,338,883 | 7/1982 | Mahler | 118/719 |
| 4,450,186 | 5/1984 | Shinohara | 118/720 X |

FOREIGN PATENT DOCUMENTS

| | | | |
|---|---|---|---|
| 2460989 | 8/1975 | Fed. Rep. of Germany | 118/719 |
| 2380353 | 10/1978 | France | 118/719 |
| WO82/02687 | 8/1982 | PCT Int'l Appl. | 118/719 |

Primary Examiner—John D. Smith
Assistant Examiner—Bernard F. Plantz
Attorney, Agent, or Firm—Francis W. Lemon

[57] ABSTRACT

A vacuum coating vessel is provided comprising a casing having a vacuum coating compartment separated from a vapor source compartment by a partition having vapor ports. A slidable shutter plate is provided on the vapor source compartment side of the partition. The shutter plate, in an open position, aligns vapor ports therein with the ones in the partition, and, in a closed, closes the vapor ports with 'O'-ring seals. A mechanism is provided for moving the shutter plate away from and then towards the partition at the beginning and end respectively of each stroke to avoid scraping the 'O'-rings and to ensure that the 'O'-rings are kept as clean as possible. The vapor ports of the shutter plate and the partition are chamfered away from the vapor source compartment so that the 'O'-ring sealing surfaces around the vapor ports in the partition are masked when the shutter plate is in the open position. When two or more vapor ports are provided, the length of stroke of the shutter plate is reduced by arranging the vapor ports at an angle of about 45° across the direction of travel of the shutter plate so that the length of stroke is only that required for a single port. It should be noted that vapor actually passes through vapor ports in the shutter plate, while in conventional gate valves vapor passes directly through an opening in the casing when the valve plate is slid to the open position.

4 Claims, 3 Drawing Figures

VACUUM COATING VESSEL WITH MOVABLE SHUTTER PLATE

This invention relates to a vacuum coating vessel.

It has already been proposed in U.S. Pat. No. 3,641,973, dated Feb. 15, 1972, R. L. Shrader, to provide a vacuum coating apparatus wherein substrates, e.g., optical lenses, to be coated, supported on a substrate holder, may be inserted into and removed from an isolatable region of the vacuum chamber, which isolatable region may be sealed off by a movable gate, whereby the remaining regions of the vacuum chamber may be maintained under vacuum while inserting and removing substrate holders. The isolatable region is isolatable, by means of a vacuum seal gate, from the regions in which the vapour source and the vacuum are maintained to permit access to the support means without losing vacuum in the entire chamber. This reduces the amount of time required to bring the isolatable region to the desired vacuum, after the isolatable region has been opened to atmosphere to replace the substrate holder. The movable gate is movable horizontally on tracks to cover or expose an inverted-cup-shaped isolatable region from the vapour source. Once in the covering position, the movable gate is moved vertically by a plurality of piston-type actuators so that an annular rim on the top of the gate enters into sealing engagement with the lower edge of the cylindrical wall of the inverted-cup-shaped isolatable region thereby sealing the isolatable regin from the regions containing the vapour source and the retracted, movable gate. However, because the value is in close proximity to the substrate holder, its size, and consequently its strokes are governed by the size of the holder and casing. Consequently the valve is large and bulky.

While the Shrader apparatus has undoubtably proved to be useful, there is a need for a vacuum coating vessel wherein the 'O'-ring seals and the surfaces of a vessel which are to be sealed by the 'O'-ring seals, when the isolatable region is sealed, are masked from the deposition thereon of vapour, dust and dirt at both ends of the stroke of the movable gate because this has been found to cause rapid failure of 'O'-ring seals. Also there is a need for a closure device for a vacuum which is compact, both in the stroke required to close and open the valve, and in its height so that a short source-to-substrate distance can be attained, thus resulting in a higher rate of deposition.

According to the present invention there is provided a vacuum coating vessel, comprising;

(a) a casing having a vacuum coating compartment and a vapour source compartment, the casing having an outlet for connection to a vacuum source, the vacuum coating compartment having access means thereto for at least one article to be vacuum coated therein, the vapour source compartment having access means thereto for placement of vapour source means therein, (b) a partition, in the casing, separating the vacuum coating compartment from the vapour source compartment, the partition having vapour inlet port means for vapour from the vapour source means for, in operation, delivering vapour from the vapour source means in the vapour source compartment to the said at least one article in the vapour coating compartment, (c) a shutter plate in the vapour source compartment and adjacent to the partition, the shutter plate having corresponding vapour port means to the said vapour inlet port means and 'O'-ring seal groove means adjacent the partition and bounding at least one closed portion of the shutter plate so that (i) when the shutter plate is in an open position the vapour port means is aligned with the vapour inlet port means in the partition, for the passage of vapour through the vapour inlet port means (while masking, from the vapour,) the side of the partition adjacent the shutter plate, and (ii) when the shutter plate is in a closed position the 'O'-ring seal groove means is aligned with the vapour inlet port means in the partition, for closing the vapour inlet port means, (d) at least one 'O'-ring seal in the 'O'-ring seal groove means for sealing the closed portion of the shutter plate to the partition in the open and in the closed positions, (e) bearing means slidably mounting opposed edge portions of the shutter plate in the vapour source compartment, for first disengaging the said at least one 'O'-ring seal from the partition, by moving the shutter plate away from the partition, then guiding the shutter plate from the open to the closed position, and then reengaging the said at least one 'O'-ring seal with the partition, and vice versa, and (f) means for moving the shutter plate from the open position to the closed position, and vice versa.

In some embodiments of the present invention there are provided a web substrate supply compartment for delivering a web substrate as the said at least one article through the access means into the vacuum coating compartment, and a web substrate receiving compartment for receiving coated web substrate from the vacuum coating compartment, and wherein the vapour inlet port means comprises a plurality of vapour inlet ports, provided with the same number of vapour ports and 'O'-ring seals, and arranged as rows extending at substantially an angle of 45° to and across the direction of movement of the shutter plate between the open and the closed positions.

In some embodiments of the present invention coolant passages are provided in the shutter plate for cooling the 'O'-ring seals.

Preferably the vapour inlet port means of the partition and the shutter plate are chamfered on the sides facing away from the vapour source compartment, at substantially the same angle so that these corresponding chamfers form substantially a continuation of one another and the shutter plate masks an 'O'-ring sealing area around the vapour inlet port means, when the shutter plate is in the open position.

Figure 2:
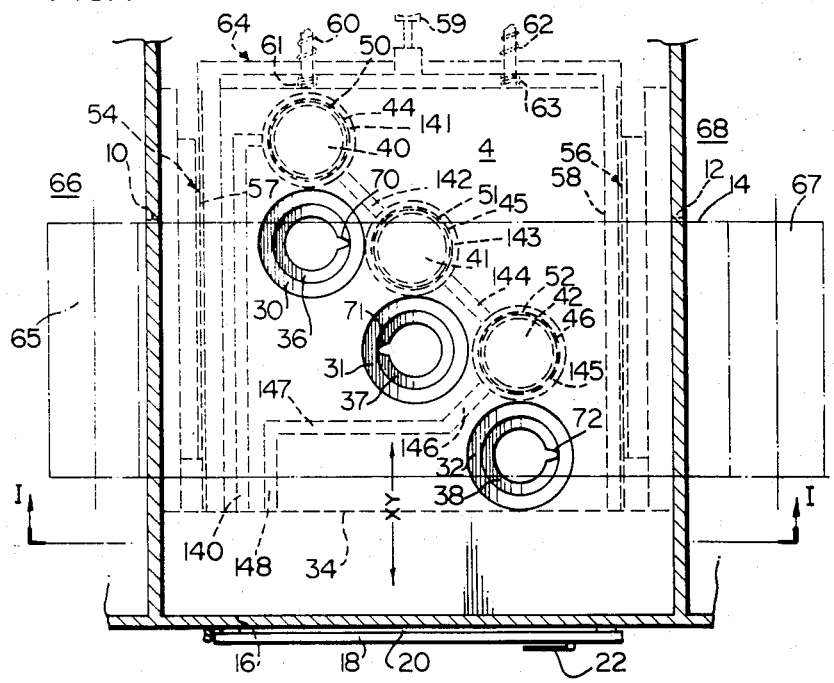
Figure 3:
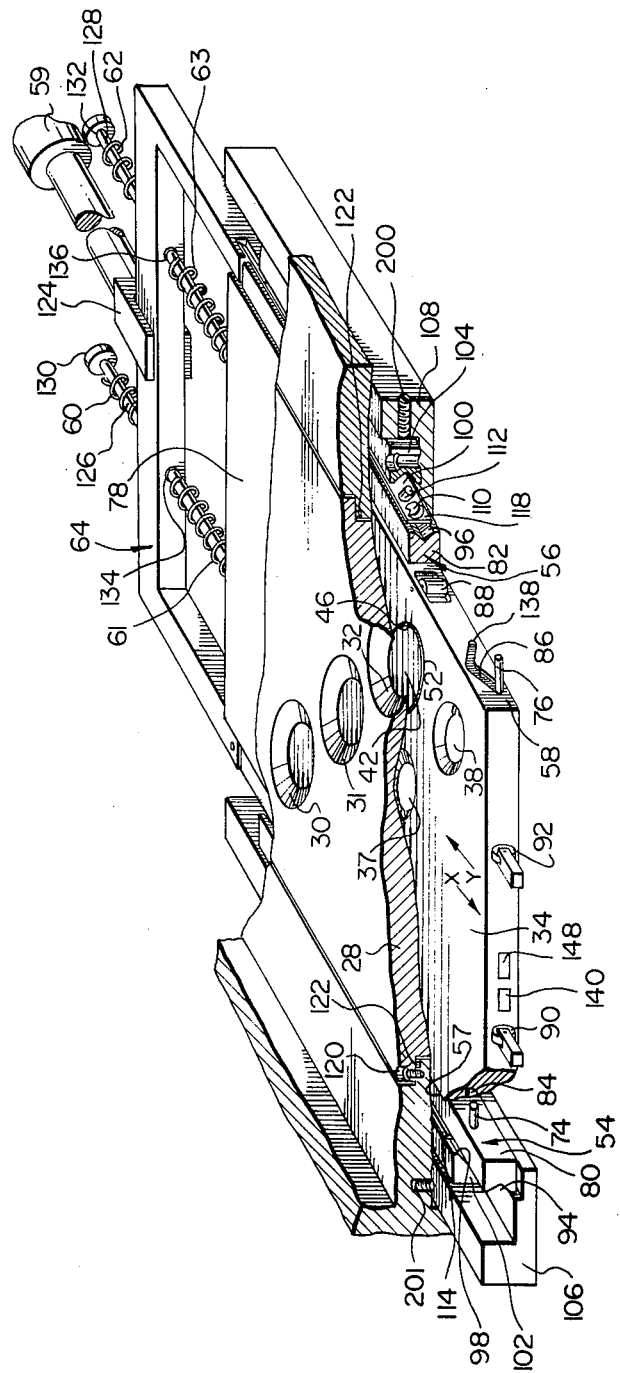

In the accompanying drawings which illustrate, by way of example, an embodiment of the present invention, FIG. 1 is a sectional side view, along I—I, FIG. 2, of a portion of a vacuum coating vessel with the shutter plate in the open position, FIG. 2 is a sectional plan view, along II—II, FIG. 1 of a portion of the vacuum coating vessel, FIG. 3 is an enlarged, partly sectioned, corner view of portions of a partition and a shutter plate assembly shown in FIGS. 1 and 2, with the shutter plate in the closed position.

Referring now to FIGS. 1 and 2 there is shown a vacuum coating vessel 1, comprising;

(a) a casing 2 having a vacuum coating compartment 4 and a vapour source compartment 6, the casing 2 having an outlet 8 for connection to a vacuum source (not shown), the vacuum coating compartment 4 having access means thereto in the form of an inlet 10 and an outlet 12 for at least one article, in this intance a web substrate 14 (shown chain dotted), to be vacuum coated therein, the vapour source compartment 6 having access means thereto, in the form of an opening 16, hinged door 18, seal 20 and lock 22, for placement of vapour source means, for exaple, in the form of crucibles 24 to 26, therein, (b) a partition 28, in the casing, separating the vacuum coating compartment 4 from the vapour source compartment 6, the partition 28 having vapour inlet port means, in the form of ports 30 to 32, for vapour from the crucibles 24 to 26 for, in operation, delivering vapour, in the form of plumes 23, from the crucibles 24 to 26 in the vapour source compartment 6 to the web substrate 14 in the vapour coating compartment 4, (c) a shutter plate 34 in the vapour source compartment 6 and adjacent to the partition 28, the shutter plate 34 having corresponding vapour port means, in the form of ports 36 to 38, to the vapour inlet ports 30 to 32 and 'O'-ring seal groove means, in the form of 'O'-ring seal grooves 44 to 46, adjacent the partition 28 and bounding at least one closed portion, in this embodiment portions 40 to 42, of the shutter plate 34 so that (i) when the shutter plate 34 is in the open position, shown in FIGS. 1 and 2, the ports 36 to 38 are aligned with the ports 30 to 32 in the partition 28, for the passage of vapour through the ports 30 to 32 while masking, from the vapour 23, the side 48 of the partition 28 adjacent the shutter plate 34, and (ii) when the shutter plate 34 is in a closed position the 'O'-ring seal grooves 44 to 46 are aligned with the ports 30 to 32 respectively in the partition 28, for closing the ports 30 to 32, (d) 'O'-ring seals 50 to 52 in the 'O'-ring seal grooves 44 to 46 respectively, for sealing the closed positions 40 to 42 of the shutter plate 34 to the partition 28 in the open and in the closed positions, (e) bearing means, generally designated 54 and 56, slidably mounting opposed edge portions 58 and 60 of the shutter plate 34 in the vapour source compartment, for first disengaging the 'O'-ring seals 50 to 52 from the partition 28, by moving the shutter plate 34 away from the partition 28, then guiding the shutter plate 34 from the open to the closed position, and then reengaging the 'O'-ring seals 50 to 52 with the partition 28, and vice versa, and (f) means, in the form of a double acting piston and cylinder assembly 59 and compression springs 60 to 63 and U-shaped frame 64, for moving the shutter plate 34 from the open position to the closed position, and vice versa.

The web substrate 14 is delivered to the vacuum coating compartment 4 from a reel thereof 65 (shown chain-dotted) in a web substrate supply compartment 66. The coated web substrate 14 is received from the vacuum coating compartment 4 on a take-up reel 67 (shown chain-dotted) in a web substrate receiving compartment 68.

The casing 2 is preferably of stainless steel with a stainless steel removable lining to avoid contamination of the casing by the vapour.

The 'O'-ring seals 50 to 52 are preferably those of polytetrafluoroethylene marketed under the trade mark "VITON" by E. I. DuPont.

The vapor is preferably generated by resitance or induction heated sources or by conventional electron beam devices (not shown), in which case slots 70 to 72 are provided for the paths of the electron beams.

In FIG. 3, similar parts to those shown in FIGS. 1 and 2 are designated by the same reference numerals and the previous description is relied upon to describe them.

In FIGS. 1 to 3 the shutter plate 34 is supported by four pins, two of which are shown and designated 74 and 76, in the U-frame 64. The two pins not shown are identical to those shown and designated 74 and 76 and support the rear end 78 of the shutter plate 34 in the same manner. The pins 74 and 76 are firmly secured in the arms 80 and 82 of the U-shaped frame 64 and are slidably held in inverted V-shaped slots 84 and 86 respectively in the shutter plate 34. Rollers, such as that designated 88, are provided to guide the shutter plate 34 when the pins 74 and 76 slide along the inverted V-shaped slots 84 and 86. Stop rollers, such as those shown and designated 90 and 92, are rotatably mounted at each end of the vapour source compartment 6 to accurately locate the shutter plate 34 at each end of sliding relative to the partition 28. The stop rollers (not shown) at the rear of the vapour source compartment 6 are located below to clear the U-shaped frame 64 and the shutter plate 34.

Rollers 88 provide rolling motion between the shutter plate 34 and arms 82 and 80. When, plate 34, reaches stops 90 and 92 and similar stops (not shown) in the rear of the vapour source compartment, arms 82 and 80 continue to move relative to plate 34 since they are still being pushed by the U-shaped bracket 64 and pneumatic cylinder 59. This extra motion of arms 82 and 80 while plate 34 is held stationary against stops 90 and 92 is what provides the raising and lowering movement of plate 34 at the end of each stroke.

The arms 80 and 82 of the U-shaped frame 64 having V-shaped grooves 94 and 96, respectively, extending therealong and facing corresponding V-shaped grooves 98 and 100 in support rails 102 and 104 mounted in the vapour source compartment 6 by brackets 106 and 108. Rolls, such as those shown and designated 110 and 112, are distributed along and are held captive by, retaining plates 114 and 118. The curved surfaces of the rolls such as 110 and 112 rest in the V-shaped grooves 94, 96, 98 and 100 thereby supporting the arms 80 and 82 in a slidable manner.

Set screws, such as that shown and designated 200, are mounted in the side brackets 108, and adjust the side pre-load between support rails 104 and 102, rollers 110 and 112, arms 82 and 80 and plate 34. Once proper pre-load is determined, support rails 104 and 102 are secured to brackets 106 and 108 by means screws 202.

Brackets 106 and 108 can be secured together front and back by tie bars (not shown) to allow removal of complete assembly by removing a series of screws, such as that shown and designated 201, disconnecting water lines and pneumatic cylinder coupling 124, without disturbing side pre-load adjustment. Similarly side pre-load adjustment can be done on a work bench where easy access is available and then mounted back in vapour source compartment fully adjusted.

It should be noted that the partition 28 is removably secured in the vessel 1 by bolts, such as that shown and designated 120, and is sealed therein by endless seal 122 for ease of cleaning and replacement. One feature of partition 28 is that more than one exists with different evaporation port patterns, and that by changing it, and the shutter plate assembly, different sources, and source patterns can be used without major modifications to the vacuum coating compartment 4 or to the vapour source compartment (e.g. when electron beam gun sources and resistance heated evaporation sources are used).

The double acting piston and cylinder assembly 59 is coupled to the U-shaped frame 64 by a coupling 124, and the compression springs 60, 61 and 62, 63 are supported on pins 126 and 128 respectively, which have flanges 130 and 132 respectively, and which are slidably held in bores 134 and 136 respectively, in the U-shaped frame 64, and are secured against relative movement to the shutter plate 34.

Referring now to FIGS. 1 to 3, in operation the apparatus is arranged as shown in FIGS. 1 and 2, with the shutter plate 34 in the open position. The vacuum coating compartment 4 and the vapour source compartment 6 are evacuated to a vacuum of about $10^{-6}$ Torr, the web substrate 14 is continuously fed into the vacuum coating compartment 4 through inlet 10 and continuously removed therefrom through outlet 12, and the crucibles 24 to 26 are charged with coating material and heated to supply vapour 23 through the ports 30 to 32.

As the web substrate 14 is drawn through the vacuum coating compartment 4 it receives a coating from the vapour 23 on its underside.

When the charges in the crucibles 24 to 26 become depleted, or if the process is complete, the movement of the web substrate 14 through the vacuum coating compartment 4 can be arrested, and the double acting piston and cylinder assembly 59 actuated to move the shutter plate 34 in the direction of arrows X (FIGS. 2 and 3) to close the ports 30 to 32. As the double acting piston and cylinder assembly 59 pushes the shutter plate 34 in the direction of arrows X via the U-frame 64 and compression springs 61 and 63, the compression springs 61 and 63 are partially compressed, holding the U-frame 64 in equilibrium against the force of the pair of springs 60 and 62, until the shutter plate 34 reaches the stop rollers 90 and 92 (FIG. 3). When the shutter plate 34 reaches the stop rollers 90 and 92 further movement of the shutter plate 34 in the direction of arrows X is prevented but the U-frame 64 continues to be moved in this direction by the double acting piston and cylinder assembly 59.

When the shutter plate 34 is being urged between the open position shown in FIG. 2 and the closed position shown in FIG. 3, the pins such as pins 74 and 76 are held, by the equilibrium condition between the force of the pair of springs 61 and 63 and the force of the pair of springs 60 and 62, at the apexes of the inverted V-shaped slots, such as slots 84 and 86. However, when the shutter plate 34 butts against the stop rollers 90 and 92, continued movement of the U-frame 64, relative to the shutter plate 34, in the direction of arrows X, causes the pins, such as pins 74 and 76, to be moved along the V-shaped slots to the position of pin 76 in slot 86 in FIG. 3. This movement in the direction of arrows X also causes springs 61 and 63 to become compressed. This also raises the shutter plate 34. When the pneumatic cylinder gets activated in the opposite direction for the next cycle, the compression of springs 61 and 63 will return the U-frame 64 to the state of equilibrium previously mentioned. This also lowers the plate as rollers 74 and 76 return to the apexes of the inverted slots 84 and 86. In the lowered position the plate is pushed until it hits the rear stops. This causes the shutter plate 34 to be lifted in a vertical direction and compress the 'O'-ring seals 50 to 52 against the underside of the partition 28 and seal the vacuum coating compartment closed while at the same time protecting the 'O'-ring seals 50 to 52 from contamination.

The valve is only activated while the vacuum coating compartment 4 and the vapour source compartment are at the same pressure e.g. (evacuated or at atmosphere). However if the vacuum coating compartment 4 is evacuated and the vapour source compartment is vented to atmosphere with the shutter plate 34 in the closed position, the difference in pressure will help in the compression of the sealing 'O'-rings and therefore provide a better seal.

In other words the force exerted by the pneumatic cylinder only provides contact of the 'O'-rings with the partition 28, after which the force provided by the vacuum in the vacuum coating compartment pulls up the valve plate 34 so that it contacts, and is sealed against, the partition 28.

The same holds true if the valve is held in the closed position by the pneumatic cylinder and both the vacuum coating compartment 4 and the vapour source compartment 6 are at atmosphere. When pumping starts in the vacuum coating compartment 4, the force created by the pressure difference in each compartment adds to the force of the pneumatic cylinder in trying to compress the sealing 'O'-rings. Pumping of the vapour source compartment 6 only, while the vacuum coating compartment 4 is at atmosphere is not possible with the apparatus according to the present invention.

Thus, the vacuum in the vapour source compartment 6 can now be vented and the door 18 opened to recharge the crucibles 24 to 26 with coating material. With the crucibles recharged the door 18 can be closed, the vapour source compartment 6 evacuated, the fresh coating material in the crucibles heated, and the movement of the web substrate 14 through the vacuum coating compartment 4 is restarted. The shutter plate 34 is then moved in the direction of arrows Y (FIGS. 2 and 3) to open the ports 30 to 32 and, as soon as the as a vacuum of about $10^{-6}$ Torr is reached again, coating the underside of the web substrate 14 with vapour 23 is continued. It should be noted that as a vacuum is maintained in the vacuum coating chamber during shutdown the period to reestablish the vacuum of about $10^{-6}$ Torr is considerably reduced.

During initial movement of the U-frame 64 in the direction of arrows Y the shutter plate 34 is held against the stop rollers 90 and 92 by the compression springs 61 and 63 until the pins, such as pin 76, have travelled to the apex of the inverted V-shaped slots, such as slot 86, this lowers the shutter plate 34 vertically away from the partition 28. When the pins, such as pins 76, are at the apexes of the inverted V-shaped slots, such as slot 86, the U-shaped frame pulls the shutter plate 34 at which position the ports 36 to 38 of the shutter plate 34 are aligned beneath the ports 30 to 32 of the partition 28. Continued movement of the U-shaped frame 64 in the direction of arrow Y causes the pins, such as pin 76, to move along the inverted V-shaped slots to the ends thereof, such as to the end 138 (FIG. 3) of slot 86. Movement of the pins, such as pin 76, to the ends of the inverted V-shaped slots, such as to the end 138 of slot 86, causes the shutter plate 34 to be lifted vertically to seal the 'O'-ring seals 50 to 52 against the underside of the partition 28, thus protecting the 'O'-ring seals 50 to 52 from contamination by the vapour 28.

It should be noted that when a plurality of ports 30 to 32 and 36 to 38, and 'O'-rings 50 to 52 are arranged as shown in rows extending substantially at 45° to and across the directions of movement X, Y of the shutter plate 34, the stroke of the shutter plate 34 between the open and closed positions is considerably reduced over the stroke required if only one large opening were provided. It will be appreciated that when, say, five or eight ports are used then these can also be arranged in the same manner by arranging them in a quincuncial manner.

The vertical movement of the shutter plate 34 at each end of the stroke avoids damage to the 'O'-ring seals 50 to 52 by them being scraped along the underside of the partition 28.

It will be appreciated that the present invention may be used for coating optical lenses which are supported in the vacuum coating compartment during the vacuum coating operation.

It should be noted that the ports 30 to 32 and 36 to 38 are chamfered on the side facing away from the vapour source compartment, at substantially the same angle, with each port 30 to 32 forming substantially a continuation of the chamber of the corresponding port 36 to 38 and vice versa so that the shutter plate masks each 'O'-ring sealing area around a vapour inlet port, from the vapour source compartment, when the shutter plate is in the open position.

The present invention is particularly useful for the manufacture of optical interference authenticating means of the type described in U.S. Pat. No. 3,858,977, dated Jan. 7, 1975, K. M. Baird et al.

In this embodiment coolant passages in the form of cooling water passages 140 to 148 (FIG. 2) are provided in the shutter plate 34 for cooling the 'O'-ring seals 44 to 46. These cooling water passages are necessary when the heat generated at the vapour sources 24 to 26, and the proximity of the shutter plate 34 to the vapour sources 24 to 26 are such that the 'O'-ring seals 44 to 46 will be subjected to heat degradation.

To achieve a high rate of deposition it may be necessary to keep the distance between the substrates 14 and the vapour sources 24 to 26 to a minimum. This requires the overall thickness of the shutter plate 34 and the partition 28 to be as small as possible and also dictates that the size of the ports 30 to 32 and 36 to 38 be small. The smaller size of the ports 30 to 32 and 36 to 38 allows a smaller length of stroke which in turn allows a smaller vapour source compartment 6 and a smaller vacuum coating compartment 4 to be used.

I claim:
1. A vacuum coating vessel, comprising:
   (a) a casing having a vacuum coating compartment and a vapour source compartment, the casing having an outlet for connection to a vacuum source, the vacuum coating compartment having access means thereto for at least one article to be vacuum coated therein, the vapour source compartment having access means thereto for placement of vapour source means therein,
   (b) a partition, in the casing, separating the vacuum coating compartment from the vapour source compartment, the partition having vapour inlet port means for vapour from the vapour source means for, in operation, delivering vapour from the vapour source means in the vapour source compartment to the said at least one article in the vapour coating compartment,
   (c) a shutter plate in the vapour source compartment and adjacent the partition, the shutter plate having corresponding vapour port means to the said vapour inlet port means and 'O'-ring seal groove means adjacent the partition and bounding at least one closed portion of the shutter plate so that
      (i) when the shutter plate is in an open position the vapour port means is aligned with the vapour inlet port means in the partition, for the passage of vapour through the vapour inlet port means while masking, from the vapour, the side of the partition adjacent the shutter plate, and
      (ii) when the shutter plate is in a closed position the 'O'-ring seal groove means is aligned with the vapour inlet port means in the partition, for closing the vapour inlet port means,
   (d) at least one 'O'-ring seal in the 'O'-ring seal groove means for sealing the closed portion of the shutter plate to the partition in the open and in the closed positions,
   (e) bearing means slidably mounting opposed edge portions of the shutter plate in the vapour source compartment, for first disengaging the said at least one 'O'-ring seal from the partition, by moving the shutter plate away from the partition, then guiding the shutter plate from the open to the closed position, and then reengaging the said at least one 'O'-ring seal with the partition, and vice versa, and
   (f) means for moving the shutter plate from the open position to the closed position, and vice versa.

2. A vessel according to claim 1, further comprising a web substrate supply compartment for delivering a web substrate as the said at least one article through the access means into the vacuum coating compartment, and a web substrate receiving compartment for receiving coated web substrate from the vacuum coating compartment, and wherein the vapour inlet port means comprises a plurality of each of vapour inlet ports, provided with the same number of vapour ports and 'O'-ring seals, and arranged as rows extending at substantially an angle of 45° to and across the direction of movement of the shutter plate between the open and the closed positions.

3. A vessel according to claim 1, wherein the vapour inlet port means of the partition and the shutter plate are chamfered on the sides facing away from the vapour source compartment, at substantially the same angle so that these corresponding chamfers form substantially a continuation of one another and the shutter plate masks an 'O'-ring sealing area around the vapour inlet port means, when the shutter plate is in the open position.

4. A vessel according to claim 1, wherein coolant passages are provided in the shutter plate for cooling the 'O'-ring seals.

* * * * *